United States Patent
Kuo et al.

(10) Patent No.: US 9,502,426 B1
(45) Date of Patent: Nov. 22, 2016

(54) ONE TIME PROGRAMMING NON-VOLATILE MEMORY CELL

(71) Applicant: eMemory Technology Inc., Hsin-Chu (TW)

(72) Inventors: Ping-Yu Kuo, Pingtung County (TW); Kuan-Hsun Chen, Tainan (TW); Chun-Hung Lin, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/044,876

(22) Filed: Feb. 16, 2016

Related U.S. Application Data

(60) Provisional application No. 62/188,751, filed on Jul. 6, 2015.

(51) Int. Cl.
  *H01L 29/788* (2006.01)
  *H01L 27/115* (2006.01)

(52) U.S. Cl.
  CPC .............................. *H01L 27/11521* (2013.01)

(58) Field of Classification Search
  CPC .................... H01L 29/7881; H01L 27/11521; H01L 29/42324
  USPC .................................................. 257/315–316
  See application file for complete search history.

(56) References Cited

U.S. PATENT DOCUMENTS

| | | | |
|---|---|---|---|
| 6,636,442 B2 | 10/2003 | Rowlandson et al. | |
| 6,920,067 B2 | 7/2005 | Hsu et al. | |
| 6,927,997 B2 | 8/2005 | Lee et al. | |
| 6,972,446 B1 * | 12/2005 | Atsumi | G11C 16/26 257/202 |
| 7,609,539 B2 | 10/2009 | Peng et al. | |
| 2001/0040256 A1 * | 11/2001 | Trivedi | H01L 21/823462 257/368 |

\* cited by examiner

*Primary Examiner* — Theresa T Doan
(74) *Attorney, Agent, or Firm* — WPAT, PC; Justin King

(57) ABSTRACT

A one time programming non-volatile memory cell includes a first floating gate transistor with a single gate structure, an isolation transistor, and a select transistor. A first terminal of the first floating gate transistor is connected with a second control line. A floating gate of the first floating gate transistor is in a floating state. A first terminal of the isolation transistor is connected with a second terminal of the first floating gate transistor. An isolation gate of the isolation transistor is connected with an isolation line. A first terminal of the select transistor is connected with a second terminal of the isolation transistor. A second terminal of the select transistor is connected with a first control line. A select transistor of the select transistor is connected with a word line.

10 Claims, 7 Drawing Sheets

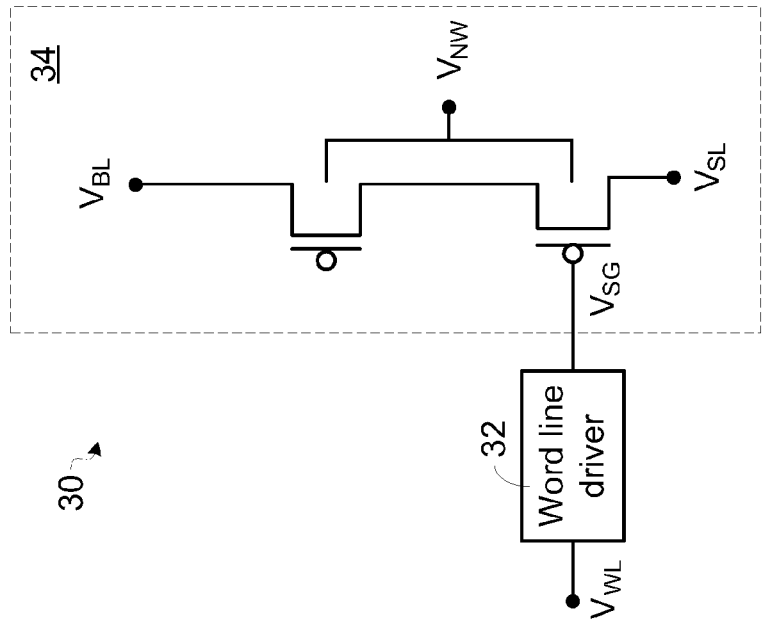
FIG. 2 (PRIOR ART)
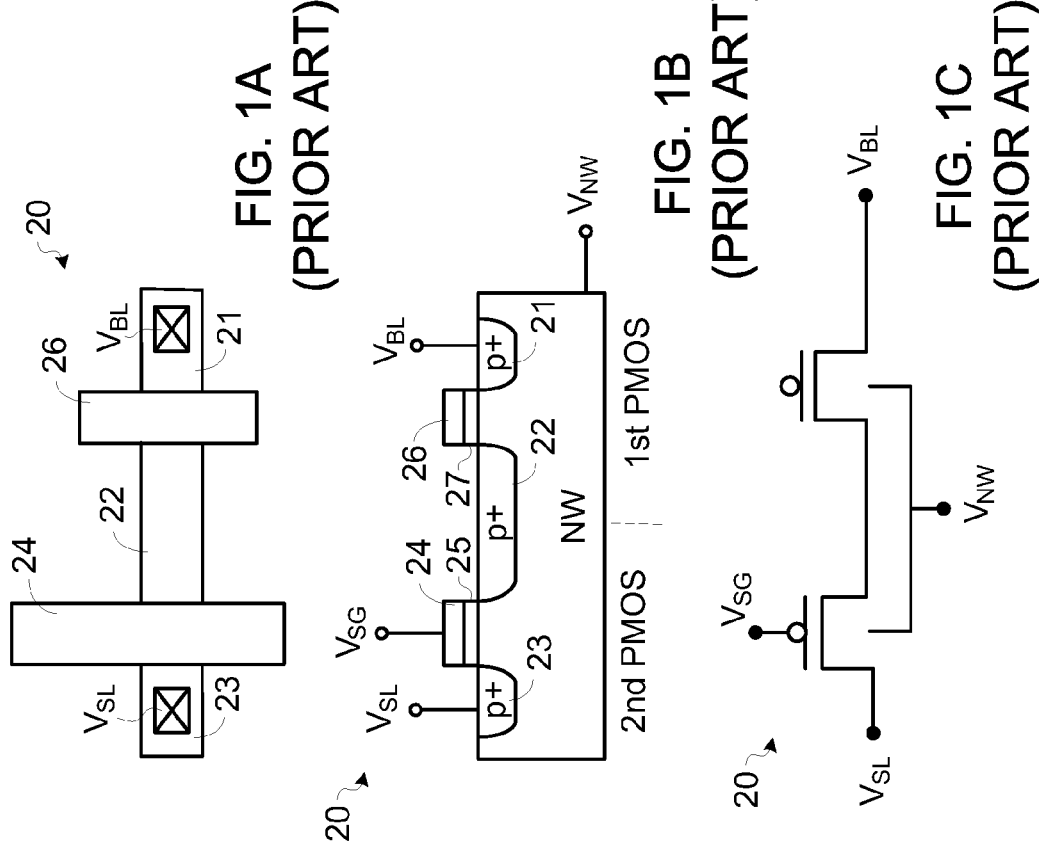
FIG. 1A (PRIOR ART)
FIG. 1B (PRIOR ART)
FIG. 1C (PRIOR ART)

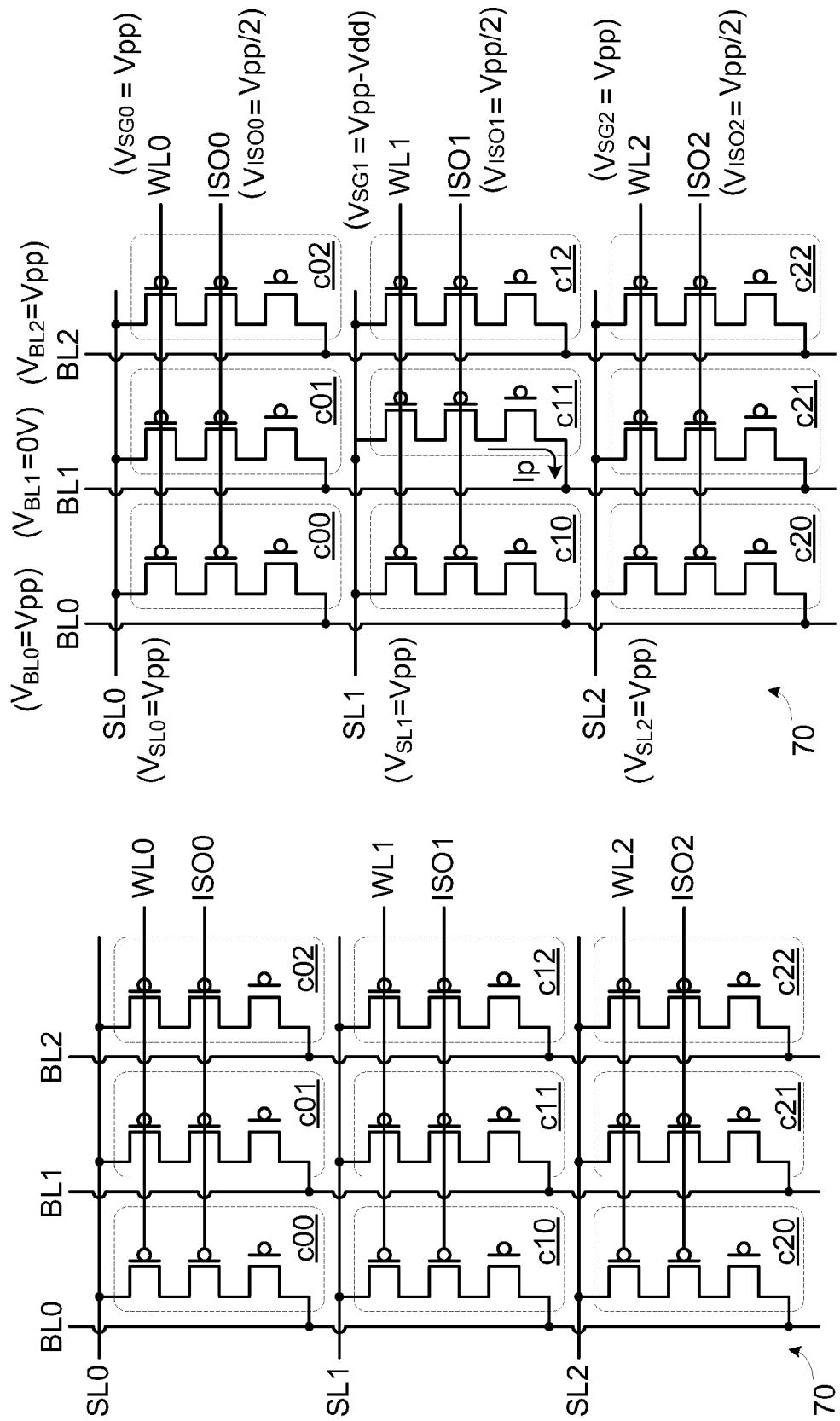

ONE TIME PROGRAMMING NON-VOLATILE MEMORY CELL

This application claims the benefit of U.S. provisional application Ser. No. 62/188,751, filed Jul. 6, 2015, the subject matter of which is incorporated herein by reference.

FIELD OF THE INVENTION

The present invention relates to a memory cell, and more particularly to a one time programming non-volatile memory cell.

BACKGROUND OF THE INVENTION

As is well known, a non-volatile memory is able to continuously retain data after the supplied power is interrupted. Generally, after the non-volatile memory leaves the factory, the user may program the non-volatile memory in order to record data into the non-volatile memory. According to the number of times the non-volatile memory is programmed, the non-volatile memory may be classified into a multi-time programming memory (also referred as a MTP memory) and a one time programming memory (also referred as an OTP memory). Basically, the stored data of the MTP memory can be modified many times. On the contrary, the OTP memory can be programmed once. After the OTP memory is programmed, the stored data fails to be modified.

For example, an OTP memory cell is disclosed in U.S. Pat. No. 6,920,067, which is entitled "Integrated circuit embedded with single-poly non-volatile memory". FIG. 1A is a schematic top view of a conventional OTP memory cell. FIG. 1B is a schematic cross-sectional view of the conventional OTP memory cell of FIG. 1A. FIG. 10 is a schematic equivalent circuit diagram of the conventional OTP memory cell of FIG. 1A.

Please refer to FIGS. 1A~1C. The conventional OTP memory cell 20 comprises two serially-connected p-type metal-oxide semiconductor (PMOS) transistors. The two PMOS transistors are constructed in an N-well region (NW). The N-well region NW is connected to an N-well voltage $V_{NW}$. The first PMOS transistor is used as a floating gate transistor. The second PMOS transistor is used as a select transistor.

In the first PMOS transistor, a gate oxide layer 27 is formed over the N-well region NW, and a floating gate 26 is formed over the gate oxide layer 27. A p-type source/drain region 21 receives a bit line voltage $V_{BL}$. Moreover, a p-type source/drain region 22 may be considered as a combination of a p-type source region of the first PMOS transistor and a p-type drain region of the second PMOS transistor.

In the second PMOS transistor, a gate oxide layer 25 is formed over the N-well region NW, and a select gate 24 is formed over the gate oxide layer 25. The select gate 24 receives a select gate voltage $V_{SG}$. Moreover, a p-type source/drain region 23 receives a source line voltage $V_{SL}$.

Generally, the p-type source/drain region 21 is connected with a bit line for receiving the bit line voltage $V_{BL}$, the select gate 24 of the second PMOS transistor is connected with a word line for receiving the select gate voltage $V_{SG}$, and the p-type source/drain region 23 is connected with a source line for receiving a source line voltage $V_{SL}$. By properly controlling the select gate voltage $V_{SG}$, the source line voltage $V_{SL}$, the bit line voltage $V_{BL}$ and the N-well voltage $V_{NW}$, the conventional OTP memory cell 20 may be operated in a program cycle or a read cycle.

In the conventional OTP memory cell 20, the floating gate transistor with two gate structure in the early stage is modified as the floating gate transistor with single gate structure. That is, the floating gate transistor in the early stage has the floating gate and the control gate. Whereas, the conventional OTP memory cell 20 has a single floating gate but does not have the control gate. Since the two PMOS transistors of the conventional OTP memory cell 20 have respective gates 24 and 26, the process of fabricating the conventional OTP memory cell 20 is compatible with the standard CMOS manufacturing process.

Nowadays, the CMOS manufacturing process is selected according to the operating voltage range of the semiconductor device. For example, the CMOS manufacturing process for a medium voltage device (MV device) is used to fabricate a transistor with higher voltage stress, and this transistor is suitable for the medium voltage operation. In addition, the CMOS manufacturing process for a low voltage device is used to fabricate a transistor with fast computing speed and lower voltage stress, and this transistor is suitable for the low voltage operation. For example, in the medium voltage operation, the voltage stress that can be withstood by the region between the gate terminal and the source terminal of the transistor is in the range between 3.0V and 6.5V. Moreover, in the low voltage operation, the voltage stress that can be withstood by the region between the gate terminal and the source terminal of the transistor is in the range between 1.8V and 2.0V.

Generally, an integrated circuit comprises an input/output device (I/O device) and a core device. The I/O device can withstand high voltage stress. The core device is operated at a high speed. That is, in the manufacturing process of an integrated circuit, the medium voltage device manufacturing process is needed to fabricate the I/O device and the low voltage device manufacturing process is needed to fabricate the core device.

Moreover, during the program cycle of the conventional OTP memory cell, the voltage difference between the gate terminal and the source terminal is about 6V. In other words, the two PMOS transistors of the OTP memory cell 20 as shown in FIG. 1B are medium voltage devices. For operating the OTP memory cell 20 in a low voltage condition, it is necessary to modify the structure of the OTP memory cell 20.

FIG. 2 is a schematic equivalent circuit diagram of another conventional OTP memory cell. As shown in FIG. 2, the OTP memory cell 30 comprises a word line driver 32 and a storage unit 34. Similarly, both of the two serially-connected PMOS transistors of the storage unit 34 are medium voltage devices. The structures of the storage unit 34 is identical to the OTP memory cell 20 of FIG. 10, and are not redundantly described herein.

The OTP memory cell 30 is in the low voltage operation. For controlling the second PMOS transistor (i.e., the select transistor), the OTP memory cell 30 uses the word line driver 32 to increase the lower word line voltage $V_{WL}$ to the select gate voltage $V_{SG}$. Consequently, the second PMOS transistor (i.e., the select transistor), the OTP memory cell 30 can be normally operated. An example of the word line driver 32 is a level shifter.

Since the OTP memory cell 30 is additionally equipped with the word line driver 32, a great amount of electric energy is consumed during the read cycle or the program cycle.

SUMMARY OF THE INVENTION

An embodiment of the present invention provides a one time programming non-volatile memory cell. The one time programming non-volatile memory cell is connected between a first control line and a second control line. The one time programming non-volatile memory cell includes a first floating gate transistor with a single gate structure, an isolation transistor, and a select transistor. A first terminal of the first floating gate transistor is connected with the second control line. A floating gate of the first floating gate transistor is in a floating state. A first terminal of the isolation transistor is connected with a second terminal of the first floating gate transistor. An isolation gate of the isolation transistor is connected with an isolation line. A first terminal of the select transistor is connected with a second terminal of the isolation transistor. A second terminal of the select transistor is connected with the first control line. A select transistor of the select transistor is connected with a word line.

An embodiment of the present invention provides a one time programming non-volatile memory cell. The one time programming non-volatile memory cell includes a P-type substrate, a first gate oxide layer, a second gate oxide layer, a third gate oxide layer, a first p-type source/drain region, a second p-type source/drain region, a third p-type source/drain region, a fourth p-type source/drain region, a floating gate, an isolation gate, and a select gate. An N-well region is disposed under a first surface of the P-type substrate. The first p-type source/drain region is connected with a bit line. The first p-type source/drain region and the second p-type source/drain region are disposed under the first surface of the P-type substrate, and respectively located at two opposed sides of the first gate oxide layer. The second p-type source/drain region and the third p-type source/drain region are disposed under the first surface of the P-type substrate, and respectively located at two opposed sides of the second gate oxide layer. The fourth p-type source/drain region is connected with a source line. The third p-type source/drain region and the fourth p-type source/drain region are disposed under the first surface of the P-type substrate, and respectively located at two opposed sides of the third gate oxide layer. The floating gate is disposed over the first gate oxide layer. The isolation gate is disposed over the second gate oxide layer, and connected with an isolation line. The select gate is disposed over the third gate oxide layer, and connected with a word line. The first gate oxide layer is thicker than the second gate oxide layer. The first gate oxide layer is thicker than the third gate oxide layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) is a schematic top view of a conventional OTP memory cell;

FIG. 1B (prior art) is a schematic cross-sectional view of the conventional OTP memory cell of FIG. 1A;

FIG. 1C (prior art) is a schematic equivalent circuit diagram of the conventional OTP memory cell of FIG. 1A;

FIG. 2 (prior art) is a schematic equivalent circuit diagram of another conventional OTP memory cell;

FIG. 6A is a schematic circuit diagram illustrating an OTP memory circuit composed of plural OTP memory cells according to the second embodiment of the present invention;

FIG. 6B schematically illustrate associated voltage signals for programming the OTP memory cell c11 of the OTP memory circuit of FIG. 6A;

DETAILED DESCRIPTION OF PREFERRED EMBODIMENTS

Figure 3A:
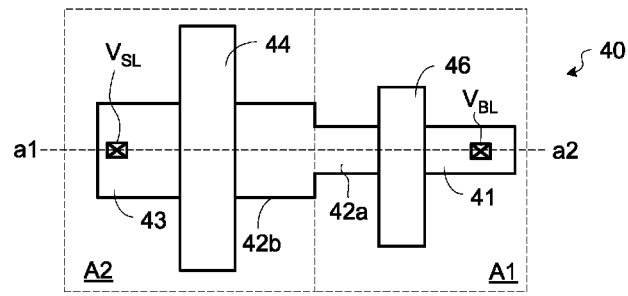
FIGS. 3A~3C schematically illustrate an OTP memory cell according to a first embodiment of the present invention.
Figure 3B:
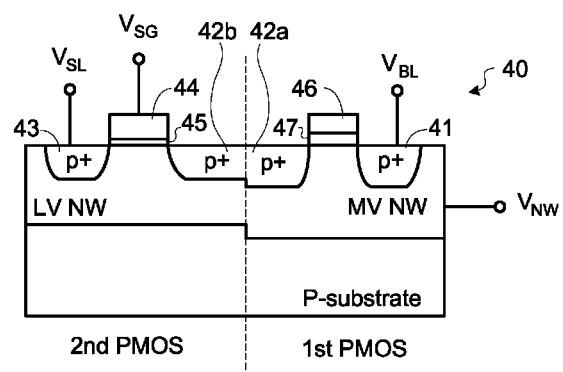
Figure 3C:
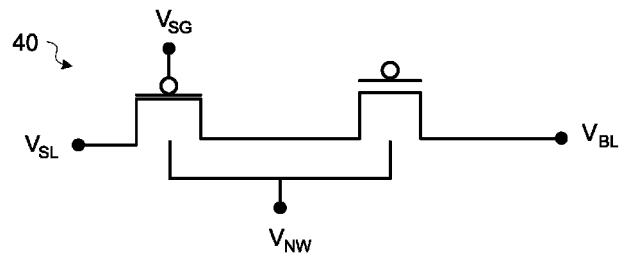

FIGS. 3A~3C schematically illustrate an OTP memory cell according to a first embodiment of the present invention. FIG. 3A is a schematic top view illustrating the OTP memory cell according to the first embodiment of the present invention. FIG. 3B is a schematic cross-sectional view illustrating the OTP memory cell of FIG. 3A and taken along a line a1-a2. FIG. 3C is a schematic equivalent circuit diagram of the OTP memory cell according to the first embodiment of the present invention.

As shown in FIGS. 3A~3C, the OTP memory cell 40 comprises two p-type metal-oxide semiconductor (PMOS) transistors. A medium voltage device manufacturing process is used for fabricating the first PMOS transistor in a first zone A1. A low voltage device manufacturing process is used for fabricating the second PMOS transistor in a second zone A2.

The medium voltage device manufacturing process will be described as follows. Firstly, a medium voltage N-well region (MV NW) is formed in a surface of a P-type substrate (P-substrate) corresponding to the first zone A1. Then, a gate oxide layer 47 and a floating gate 46 are formed over the medium voltage N-well region (MV NW). Then, a p-type source/drain region 41 and a p-type source/drain region 42a are formed in the P-type substrate. The p-type source/drain region 41 and the p-type source/drain region 42a are located at bilateral sides of the gate oxide layer 47. The p-type source/drain region 41 receives a bit line voltage $V_{BL}$. After the medium voltage device manufacturing process is completed, the first PMOS transistor is fabricated. In this embodiment, the first PMOS transistor is a floating gate transistor.

The low voltage device manufacturing process will be described as follows. Firstly, a low voltage N-well region (LV NW) is formed in the surface of the P-type substrate corresponding to the second zone A2. Then, a gate oxide layer 45 and a select gate 44 are formed over the low voltage N-well region (LV NW). Then, a p-type source/drain region 43 and a p-type source/drain region 42b are formed in the P-type substrate. The p-type source/drain region 43 and the p-type source/drain region 42b are located at bilateral sides of the gate oxide layer 45. The p-type source/drain region 43 receives a source line voltage $V_{SL}$. The select gate 44 receives a select gate voltage $V_{SG}$. After the low voltage device manufacturing process is completed, the second PMOS transistor is fabricated. In this embodiment, the second PMOS transistor is a select transistor.

As shown in FIG. 3B, the medium voltage N-well region (MV NW) and the low voltage N-well region (LV NW) are in contact with each other. Consequently, the medium voltage N-well region (MV NW) and the low voltage N-well region (LV NW) may be considered as an N-well region that receives an N-well voltage $V_{NW}$. Moreover, the p-type source/drain region 42a and the p-type source/drain region 42b are in contact with each other. Consequently, the p-type source/drain region 42a and the p-type source/drain region 42b may be considered as a combined p-type source/drain region. In this embodiment, the gate oxide layer 47 of the first PMOS transistor is thicker than the gate oxide layer 45 of the second PMOS transistor, the low voltage N-well region (LV NW) is shallower than the medium voltage N-well region (MV NW), and the p-type source/drain region 42b is shallower than the p-type source/drain region 42a.

In another embodiment, the gate oxide layer 47 of the first PMOS transistor is thicker than the gate oxide layer 45 of the second PMOS transistor, the low voltage N-well region (LV NW) and the medium voltage N-well region (MV NW) maybe have the same depth, and the p-type source/drain region 42b and the p-type source/drain region 42a maybe have the same depth.

From the above descriptions, the OTP memory cell 40 comprises two serially-connected PMOS transistors. The two PMOS transistors are constructed in the medium voltage N-well region (MV NW) and the low voltage N-well region (LV NW), respectively. Since the gate oxide layer 45 of the second PMOS transistor is thinner, the threshold voltage of the second PMOS transistor is lower. Consequently, by controlling the voltage difference between the select gate voltage $V_{SG}$ and the source line voltage $V_{SL}$ to be in the range between 1.8V and 2.0V, the second PMOS transistor is suitable for the low voltage operation.

However, during the program cycle of the OTP memory cell 40, a large program current flows through the second PMOS transistor (i.e., the select transistor). If the voltage is improperly biased, the source-drain voltage of the second PMOS transistor is too high. Under this circumstance, the source-drain voltage of the second PMOS transistor is possibly higher than the voltage stress that can be withstood by the second PMOS transistor. Because of the overstressing phenomenon, the second PMOS transistor is possibly burnt out.

Figure 4A:
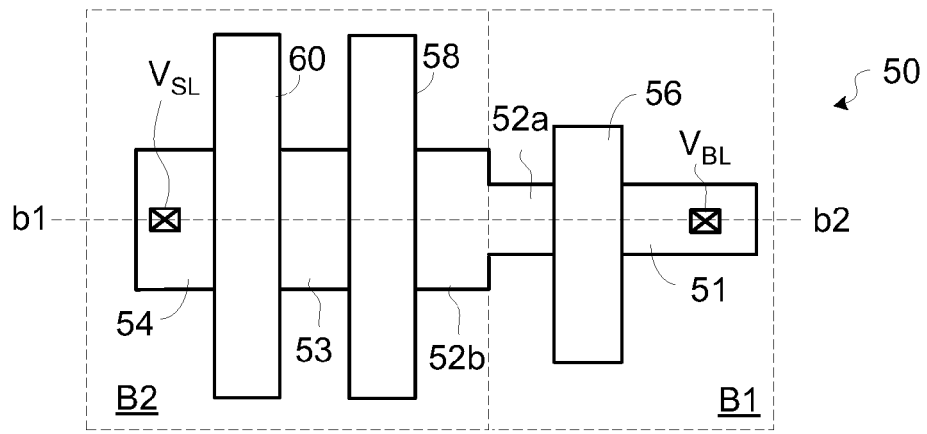
FIGS. 4A~4C schematically illustrate an OTP memory cell according to a second embodiment of the present invention.
Figure 4B:
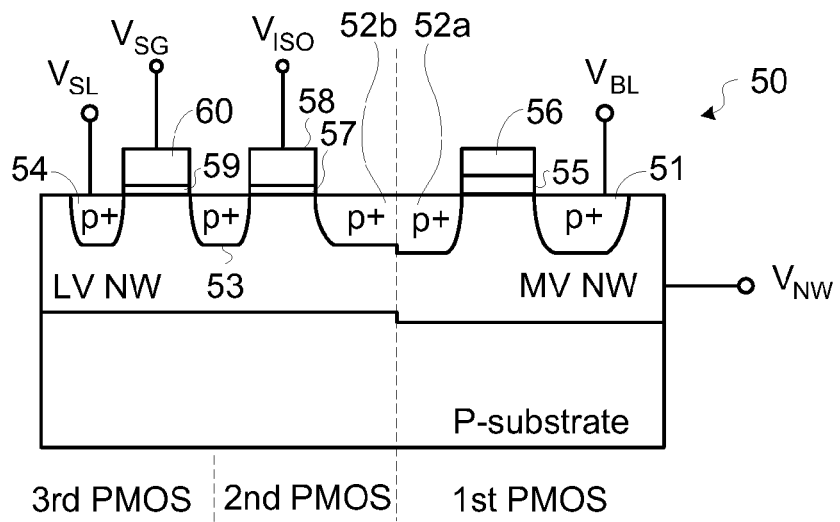
Figure 4C:
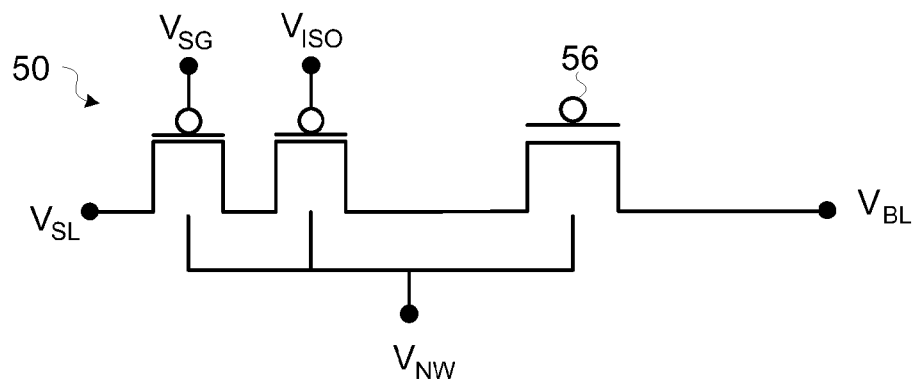

FIGS. 4A~4C schematically illustrate an OTP memory cell according to a second embodiment of the present invention. FIG. 4A is a schematic top view illustrating the OTP memory cell according to the second embodiment of the present invention. FIG. 4B is a schematic cross-sectional view illustrating the OTP memory cell of FIG. 4A and taken along a line b1-b2. FIG. 4C is a schematic equivalent circuit diagram of the OTP memory cell according to the second embodiment of the present invention.

As shown in FIGS. 4A~4C, the OTP memory cell 50 comprises three p-type metal-oxide semiconductor (PMOS) transistors. A medium voltage device manufacturing process is used for fabricating the first PMOS transistor in a first zone B1. A low voltage device manufacturing process is used for fabricating the second PMOS transistor and the third PMOS transistor in a second zone B2.

The medium voltage device manufacturing process will be described as follows. Firstly, a medium voltage N-well region (MV NW) is formed in a surface of a P-type substrate (P-substrate) corresponding to the first zone B1. Then, a gate oxide layer 55 and a floating gate 56 are formed over the medium voltage N-well region (MV NW). Then, a p-type source/drain region 51 and a p-type source/drain region 52a are formed in the P-type substrate. The p-type source/drain region 51 and the p-type source/drain region 52a are located at bilateral sides of the gate oxide layer 55. The p-type source/drain region 51 receives a bit line voltage $V_{BL}$. After the medium voltage device manufacturing process is completed, the first PMOS transistor is fabricated. In this embodiment, the first PMOS transistor is a floating gate transistor.

The low voltage device manufacturing process will be described as follows. Firstly, a low voltage N-well region (LV NW) is formed in the surface of the P-type substrate corresponding to the second zone B2. Then, a gate oxide layer 57 and a gate oxide layer 59 are formed over the low voltage N-well region (LV NW). Then, an isolation gate 58 and a select gate 60 are formed over the gate oxide layer 57 and the gate oxide layer 59, respectively. Then, three p-type source/drain regions 52b, 53 and 54 are formed in the P-type substrate. The p-type source/drain region 52b is located at a right side of the gate oxide layer 57. The p-type source/drain region 53 is arranged between the gate oxide layer 57 and the gate oxide layer 59. The p-type source/drain region 54 is located at a left side of the gate oxide layer 59. The p-type source/drain region 54 receives a source line voltage $V_{SL}$. The isolation gate 58 receives an isolation gate voltage $V_{ISO}$. The select gate 60 receives a select gate voltage $V_{SG}$. After the low voltage device manufacturing process is completed, the second PMOS transistor and the third PMOS transistor are fabricated. In this embodiment, the second PMOS transistor is an isolation transistor, and the third PMOS transistor is a select transistor.

As shown in FIG. 4B, the medium voltage N-well region (MV NW) and the low voltage N-well region (LV NW) are in contact with each other. Consequently, the medium voltage N-well region (MV NW) and the low voltage N-well region (LV NW) may be considered as an N-well region that receives an N-well voltage $V_{NW}$. Moreover, the p-type source/drain region 52a and the p-type source/drain region 52b are in contact with each other. Consequently, the p-type source/drain region 52a and the p-type source/drain region 52b may be considered as a combined p-type source/drain region. In this embodiment, the gate oxide layer 55 of the first PMOS transistor is thicker than the gate oxide layer 57 of the second PMOS transistor, and the gate oxide layer 55 of the first PMOS transistor is thicker than the gate oxide layer 59 of the third PMOS transistor, the low voltage N-well region (LV NW) is shallower than the medium voltage N-well region (MV NW), and the p-type source/drain region 52b is shallower than the p-type source/drain region 52a.

In another embodiment, the gate oxide layer 55 of the first PMOS transistor is thicker than the gate oxide layer 57 of the second PMOS transistor, and the gate oxide layer 55 of the first PMOS transistor is thicker than the gate oxide layer 59 of the third PMOS transistor, the low voltage N-well region (LV NW) and the medium voltage N-well region (MV NW)

maybe have the same depth, and the p-type source/drain region 42b and the p-type source/drain region 42a maybe have the same depth.

From the above descriptions, the OTP memory cell 50 comprises three serially-connected PMOS transistors. The first PMOS transistor is constructed in the medium voltage N-well region (MV NW), and the second PMOS transistor and the third PMOS transistor are constructed in the low voltage N-well region (LV NW). Since the gate oxide layer 57 of the second PMOS transistor and the gate oxide layer 59 of the third PMOS transistor are thinner, the threshold voltages of the second PMOS transistor and the third PMOS transistor are lower. Consequently, the second PMOS transistor and the third PMOS transistor are suitable for the low voltage operation.

During the program cycle of the OTP memory cell 50, a program current flows through the second PMOS transistor and the third PMOS transistor. Under this circumstance, the source-drain voltages of the second PMOS transistor and the third PMOS transistor are not higher than the withstanding voltage stress. Consequently, the second PMOS transistor and the third PMOS transistor are normally operated and not burnt out.

In this embodiment, the p-type source/drain region 51 of the first PMOS transistor is connected with a bit line to receive a bit line voltage $V_{BL}$, the isolation gate 58 of the second PMOS transistor is connected with an isolation line to receive an isolation gate voltage $V_{ISO}$, the select gate 60 of the third PMOS transistor is connected with a word line to receive a select gate voltage $V_{SG}$, and the p-type source/drain region 54 of the third PMOS transistor is connected with a source line to receive a source line voltage $V_{SL}$. By properly controlling the select gate voltage $V_{SG}$, the source line voltage $V_{SL}$, the isolation gate voltage $V_{ISO}$, the bit line voltage $V_{BL}$ and the N-well voltage $V_{NW}$, the conventional OTP memory cell 50 may be operated in a program cycle or a read cycle.

Figure 5A:
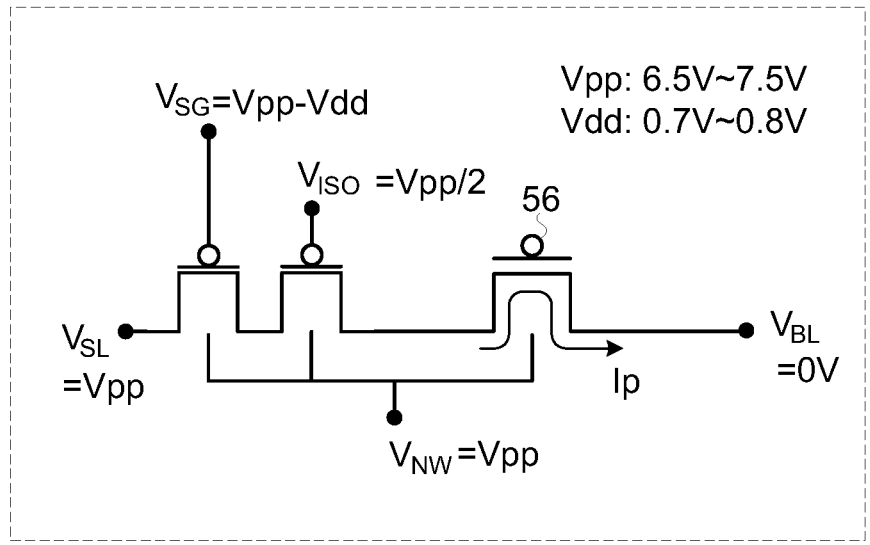
FIGS. 5A and 5B schematically illustrate associated voltage signals for programming and reading the OTP memory cell according to the second embodiment of the present invention.
Figure 5B:
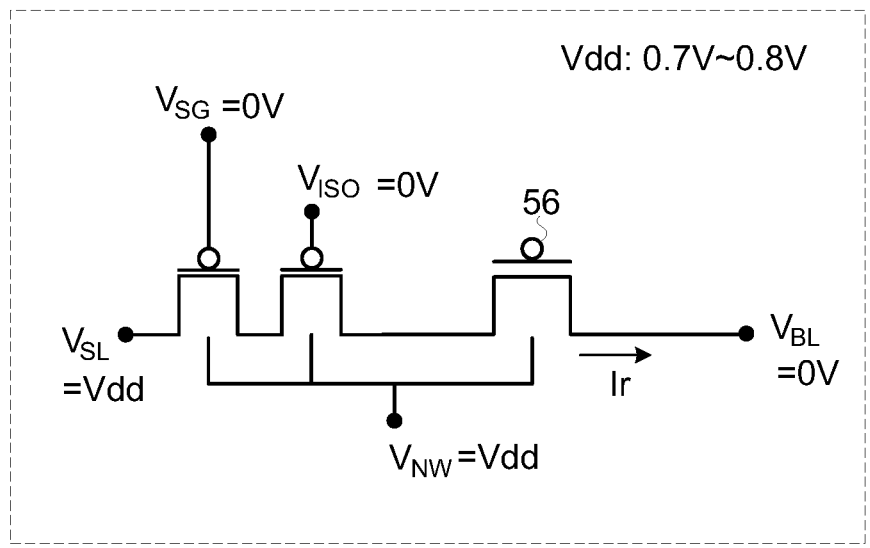

FIGS. 5A and 5B schematically illustrate associated voltage signals for programming and reading the OTP memory cell according to the second embodiment of the present invention.

Please refer to FIG. 5A. During the program cycle, the bit line voltage $V_{BL}$ is 0V, the isolation gate voltage $V_{ISO}$ is equal to Vpp/2, the select gate voltage $V_{SG}$ is equal to (Vpp−Vdd), the N-well voltage $V_{NW}$ is equal to Vpp, and the source line voltage $V_{SL}$ is equal to Vpp. In an embodiment, the magnitude of the first voltage Vpp is in the range between 6.5V and 7.5V, and the magnitude of the second voltage Vdd is in the range between 0.7V and 0.8V.

During the program cycle, both of the select transistor and the isolation transistor are turned on. Consequently, a program current Ip flows through a channel region of the floating gate transistor, and hot carriers are injected into the floating gate 56.

Please refer to FIG. 5B. During the read cycle, the bit line voltage $V_{BL}$ is 0V, the isolation gate voltage $V_{ISO}$ is 0V, the select gate voltage $V_{SG}$ is 0V, the N-well voltage $V_{NW}$ is equal to Vdd, and the source line voltage $V_{SL}$ is equal to Vdd. In an embodiment, the magnitude of the second voltage Vdd is in the range between 0.7V and 0.8V.

During the read cycle, both of the select transistor and the isolation transistor are turned on. According to the result of judging whether hot carriers are stored in the floating gate 56, the magnitude of a read current Ir is determined. That is, the magnitude of the read current Ir can be used to judge whether the OTP memory cell is programmed or not.

FIG. 6A is a schematic circuit diagram illustrating an OTP memory circuit composed of plural OTP memory cells according to the second embodiment of the present invention. As shown in FIG. 6A, the OTP memory circuit 70 comprises OTP memory cells c00~c22 in a 3×3 array. Each of the OTP memory cells c00~c22 has the same structure as the OTP memory cell of the second embodiment.

For example, the OTP memory cell c00 comprises three serially-connected PMOS transistors. The three PMOS transistors include a floating gate transistor, an isolation transistor and a select transistor. A first terminal of the floating gate transistor is connected with a bit line BL0. A floating gate of the floating gate transistor is in a floating state. A first terminal of the isolation transistor is connected with a second terminal of the floating gate transistor. An isolation gate of the isolation transistor is connected with an isolation line ISO0. A first terminal of the select transistor is connected with a second terminal of the isolation transistor. A second terminal of the select transistor is connected with a source line SL0. A select gate of the select transistor is connected with a word line WL0. The structures of the OTP memory cells c01~c22 are similar to the structures of the OTP memory cell c00, and are not redundantly described herein.

FIG. 6B schematically illustrate associated voltage signals for programming the OTP memory cell c11 of the OTP memory circuit of FIG. 6A. For example, the OTP memory cell c11 is a selected OTP memory cell. The source line voltage $V_{SL0}$ provided to the source line SL0, the source line voltage $V_{SL2}$ provided to the source line SL2, and the source line voltage $V_{SL1}$ provided to the source line SL1 are all equal to Vpp. The bit line voltage $V_{BL0}$ provided to the bit line BL0 is equal to Vpp, the bit line voltage $V_{BL2}$ provided to the bit line BL2 is equal to Vpp, and the bit line voltage $V_{BL1}$ provided to the bit line BL1 is 0V. The select gate voltage $V_{SG0}$ provided to the word line WL0 is equal to Vpp, the select gate voltage $V_{SG2}$ provided to the word line WL2 is equal to Vpp, and the select gate voltage $V_{SG1}$ provided to the word line WL1 is equal to (Vpp−Vdd). The isolation gate voltage $V_{ISO0}$ provided to the isolation line ISO0, the isolation gate voltage $V_{ISO1}$ provided to the isolation line ISO1 and the isolation gate voltage $V_{ISO2}$ provided to the isolation line ISO2 are all equal to Vpp/2. Moreover, the N-well voltage $V_{NW}$ is equal to Vpp.

Consequently, only the OTP memory cell c11 is programmed. A program current Ip generated by the OTP memory cell c11 flows from the source line SL1 to the bit line BL1. The other OTP memory cells are not programmed.

Figure 6C:
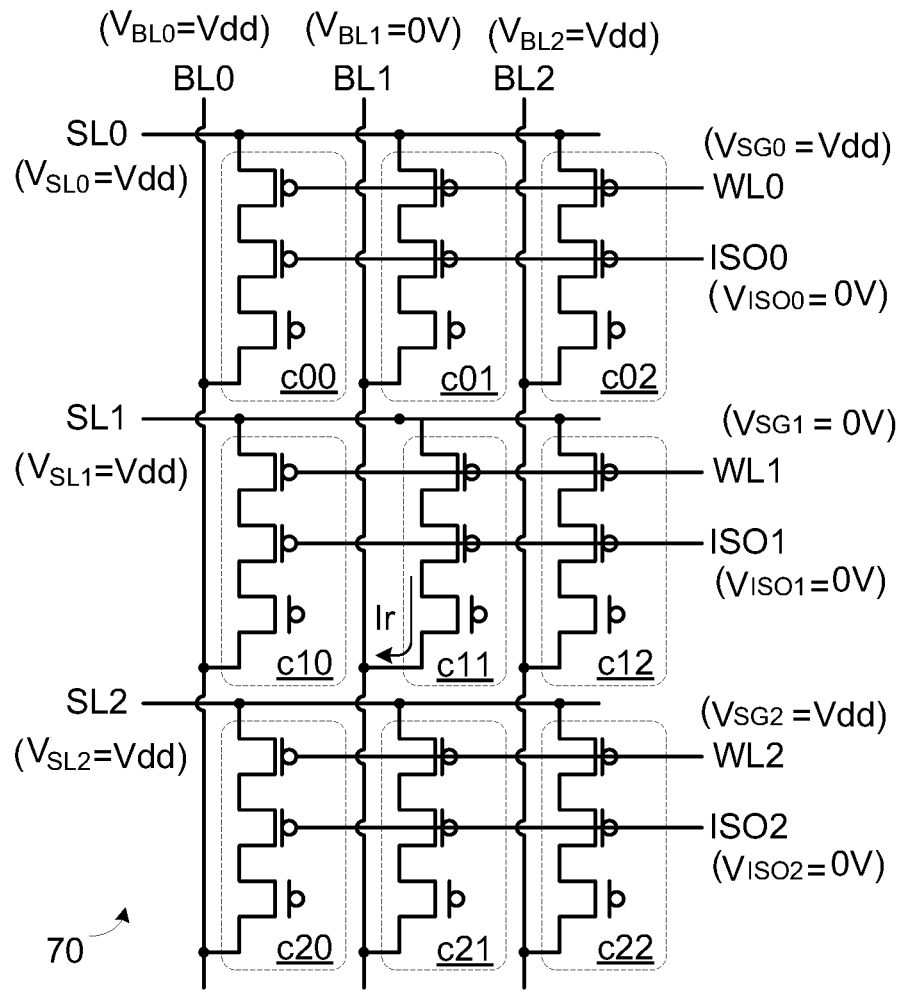
FIG. 6C schematically illustrate associated voltage signals for reading the OTP memory cell c11 of the OTP memory circuit of FIG. 6A.

FIG. 6C schematically illustrate associated voltage signals for reading the OTP memory cell c11 of the OTP memory circuit of FIG. 6A. For example, the OTP memory cell c11 is a selected OTP memory cell. The source line voltage $V_{SL0}$ provided to the source line SL0, the source line voltage $V_{SL1}$ provided to the source line SL1 and the source line voltage $V_{SL2}$ provided to the source line SL2 are all equal to Vdd. The bit line voltage $V_{BL0}$ provided to the bit line BL0 is equal to Vdd, the bit line voltage $V_{BL2}$ provided to the bit line BL2 is equal to Vdd, and the bit line voltage $V_{BL1}$ provided to the bit line BL1 is 0V. The select gate voltage $V_{SG0}$ provided to the word line WL0 is equal to Vdd, the select gate voltage $V_{SG2}$ provided to the word line WL2 is equal to Vdd, and the select gate voltage $V_{SG1}$ provided to the word line WL1 is 0V. The isolation gate voltage $V_{ISO0}$ provided to the isolation line ISO0, the isolation gate voltage $V_{ISO1}$ provided to the isolation line ISO1 and the isolation gate voltage $V_{ISO2}$ provided to the isolation line ISO2 are all equal to 0V. Moreover, the N-well voltage $V_{NW}$ is equal to Vdd.

Consequently, only the OTP memory cell c11 is read. A read current Ir generated by the OTP memory cell c11 flows from the source line SL1 to the bit line BL1. The other OTP memory cells are not read.

It is noted that the bias voltages applied to the OTP memory circuit 70 are not restricted. That is, the bias voltages applied to the OTP memory circuit 70 may be modified according to the practical requirements.

Figure 7:
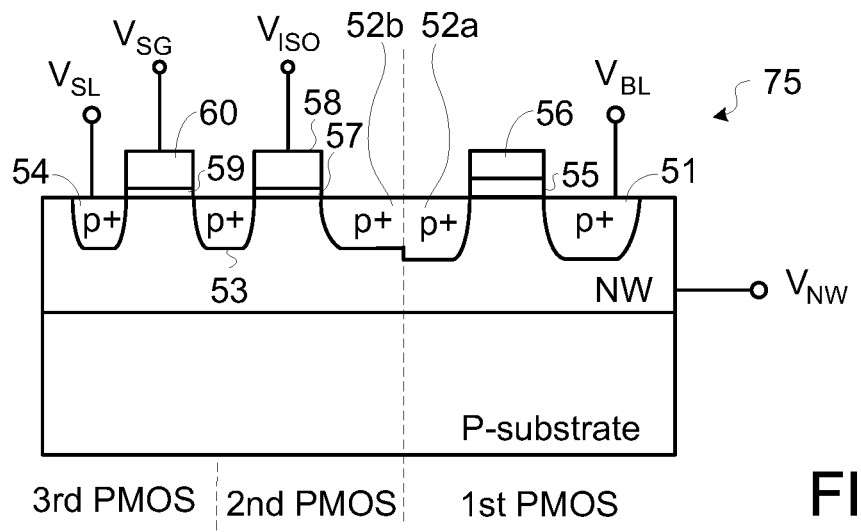
FIG. 7 is a schematic cross-sectional view illustrating an OTP memory cell according to a third embodiment of the present invention.

FIG. 7 is a schematic cross-sectional view illustrating an OTP memory cell according to a third embodiment of the present invention. In comparison with the second embodiment, the N-well region NW of the OTP memory cell 75 of this embodiment is distinguished.

In this embodiment, the N-well region NW has been previously formed in the surface of the P-type substrate. In a medium voltage device manufacturing process, the first PMOS transistor is directly formed on the N-well region NW and used as a floating gate transistor.

In a low voltage device manufacturing process, the second PMOS transistor and the third PMOS transistor are directly formed on the N-well region NW. In addition, the second PMOS transistor and the third PMOS transistor are used as an isolation transistor and a select transistor, respectively.

Figure 8:
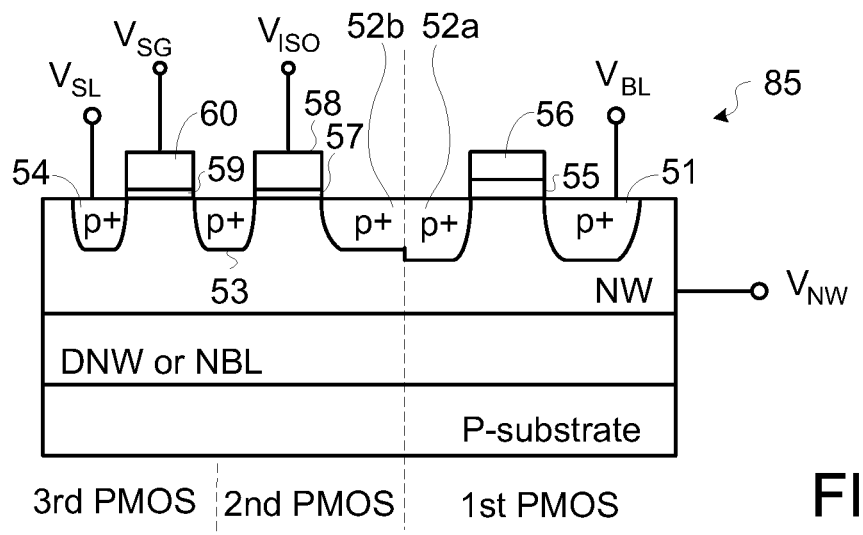
FIG. 8 is a schematic cross-sectional view illustrating an OTP memory cell according to a fourth embodiment of the present invention.

FIG. 8 is a schematic cross-sectional view illustrating an OTP memory cell according to a fourth embodiment of the present invention. In comparison with the third embodiment, the OTP memory cell 85 of this embodiment further comprises a deep N-well region (DNW) or an N-buried layer (NBL) under the N-well region NW.

In this embodiment, after the deep N-well region (DNW) or the N-buried layer (NBL) is formed in the surface of the P-type substrate and the N-well region NW is formed over the deep N-well region (DNW) or the N-buried layer (NBL), the medium voltage device manufacturing process and the low voltage device manufacturing process are performed.

It is noted that the concepts of the fourth embodiment may be modified. For example, in another embodiment, the deep N-well region (DNW) or the N-buried layer (NBL) is previously formed in the surface of the P-type substrate. In a medium voltage device manufacturing process, a medium voltage N-well region (MV NW) is formed in the P-type substrate. In a low voltage device manufacturing process, a low voltage N-well region (LV NW) is formed in the P-type substrate.

Figure 9:
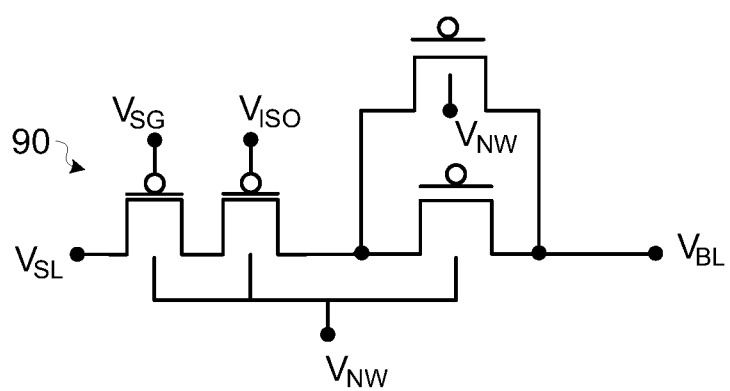
FIG. 9 is a schematic equivalent circuit diagram of an OTP memory cell according to a fifth embodiment of the present invention.

FIG. 9 is a schematic equivalent circuit diagram of an OTP memory cell according to a fifth embodiment of the present invention. In comparison with the second embodiment, the OTP memory cell 90 of this embodiment comprises plural floating gate transistors. The plural floating gate transistors are connected with each other in parallel.

In the medium voltage device manufacturing process, the plural floating gate transistors (e.g., two floating gate transistors) are fabricated. After the OTP memory cell 90 is produced, the plural floating gate transistors are used to store one bit of data. Consequently, the data accuracy of the OTP memory cell 90 is enhanced.

From the above descriptions, the present invention provides an OTP memory cell and a memory circuit thereof. The OTP memory cell comprises a select transistor, an isolation transistor and a floating gate transistor, which are connected with each other in series. Since the select transistor and the isolation transistor are fabricated by the low voltage device manufacturing process, the select transistor and the isolation transistor are suitable for the low voltage operation.

In some embodiment, after the floating gate is formed, a silicide blocking layer (not shown) is formed over the floating gate to completely cover the floating gate. Consequently, the floating gate transistor of the OTP memory cell can be protected. Since the floating gate is effectively protected, the data retention time of the OTP memory cell is extended.

In the above embodiments, the transistors of the OTP memory cell are PMOS transistors. However, those skilled in the art will readily observe that numerous modifications and alterations may be made while retaining the teachings of the invention. For example, in some other embodiments, the transistors of the OTP memory cell are p-type metal-oxide semiconductor (NMOS) transistors.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A one time programming non-volatile memory cell connected between a first control line and a second control line, the one time programming non-volatile memory cell comprising:
   a first floating gate transistor with a single gate structure, wherein a first terminal of the first floating gate transistor is connected with the second control line, and a floating gate of the first floating gate transistor is in a floating state;
   an isolation transistor, wherein a first terminal of the isolation transistor is connected with a second terminal of the first floating gate transistor, and an isolation gate of the isolation transistor is connected with an isolation line; and
   a select transistor, wherein a first terminal of the select transistor is connected with a second terminal of the isolation transistor, a second terminal of the select transistor is connected with the first control line, and a select transistor of the select transistor is connected with a word line.

2. The one time programming non-volatile memory cell as claimed in claim 1, wherein the first floating gate transistor, the isolation transistor and the select transistor are PMOS transistors, the first control line is a source line, and the second control line is a bit line.

3. The one time programming non-volatile memory cell as claimed in claim 2, wherein a gate oxide layer of the first floating gate transistor is thicker than a gate oxide layer of the isolation transistor and a gate oxide layer of the select transistor.

4. The one time programming non-volatile memory cell as claimed in claim 3, wherein the first floating gate transistor is fabricated by a medium voltage device manufacturing process, and the select transistor and the isolation transistor are fabricated by a low voltage device manufacturing process.

5. The one time programming non-volatile memory cell as claimed in claim 3, further comprising a second floating gate transistor with a single gate structure, wherein a first terminal of the second floating gate transistor is connected with the first terminal of the first floating gate transistor, a second terminal of the second floating gate transistor is connected with the second terminal of the first floating gate transistor, and a floating gate of the second floating gate transistor is in a floating state.

6. A one time programming non-volatile memory cell, comprising:
   a P-type substrate, wherein an N-well region is disposed under a first surface of the P-type substrate;
   a first gate oxide layer;
   a second gate oxide layer;
   a third gate oxide layer;
   a first p-type source/drain region connected with a bit line;
   a second p-type source/drain region, wherein the first p-type source/drain region and the second p-type source/drain region are disposed under the first surface of the P-type substrate, and respectively located at two opposed sides of the first gate oxide layer;
   a third p-type source/drain region, wherein the second p-type source/drain region and the third p-type source/drain region are disposed under the first surface of the P-type substrate, and respectively located at two opposed sides of the second gate oxide layer;
   a fourth p-type source/drain region connected with a source line, wherein the third p-type source/drain region and the fourth p-type source/drain region are disposed under the first surface of the P-type substrate, and respectively located at two opposed sides of the third gate oxide layer;
   a floating gate disposed over the first gate oxide layer;
   an isolation gate disposed over the second gate oxide layer, and connected with an isolation line;
   a select gate disposed over the third gate oxide layer, and connected with a word line,
   wherein the first gate oxide layer is thicker than the second gate oxide layer, and the first gate oxide layer is thicker than the third gate oxide layer.

7. The one time programming non-volatile memory cell as claimed in claim 6, wherein the N-well region comprises:
   a medium voltage N-well region disposed under the first gate oxide layer;
   a low voltage N-well region disposed under the second gate oxide layer and the third gate oxide layer, wherein the medium voltage N-well region and the low voltage N-well region are in contact with each other,
   wherein the medium voltage N-well region is formed by a medium voltage device manufacturing process, and the low voltage N-well region is formed by a low voltage device manufacturing process.

8. The one time programming non-volatile memory cell as claimed in claim 6, wherein the second p-type source/drain region comprises:
   a first sub-region disposed under the first surface of the P-type substrate, and located beside the first gate oxide layer;
   a second sub-region disposed under the first surface of the P-type substrate, and located beside the second gate oxide layer, wherein the first sub-region and the second sub-region are in contact with each other,
   wherein the first sub-region is formed by a medium voltage device manufacturing process, and the second sub-region is formed by a low voltage device manufacturing process.

9. The one time programming non-volatile memory cell as claimed in claim 6, further comprising a deep N-well region or an N-buried layer, wherein the deep N-well region or the N-buried layer are disposed within the P-type substrate and under the N-well region.

10. The one time programming non-volatile memory cell as claimed in claim 6, further comprising a silicide blocking layer, wherein the silicide blocking layer is formed over the floating gate to cover the floating gate.

* * * * *